(12) United States Patent
Hamada et al.

(10) Patent No.: US 10,516,017 B2
(45) Date of Patent: Dec. 24, 2019

(54) SEMICONDUCTOR DEVICE, AND MANUFACTURING METHOD FOR SAME

(71) Applicant: Mitsubishi Electric Corporation, Chiyoda-ku (JP)

(72) Inventors: Kenji Hamada, Tokyo (JP); Kazuya Konishi, Tokyo (JP); Kohei Ebihara, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/301,300

(22) PCT Filed: Jun. 5, 2017

(86) PCT No.: PCT/JP2017/020812
§ 371 (c)(1),
(2) Date: Nov. 13, 2018

(87) PCT Pub. No.: WO2018/016208
PCT Pub. Date: Jan. 25, 2018

(65) Prior Publication Data
US 2019/0198607 A1    Jun. 27, 2019

(30) Foreign Application Priority Data

Jul. 19, 2016   (JP) .................................. 2016-141050

(51) Int. Cl.
*H01L 29/10*   (2006.01)
*H01L 29/06*   (2006.01)
(Continued)

(52) U.S. Cl.
CPC .......... *H01L 29/063* (2013.01); *H01L 21/046* (2013.01); *H01L 29/1095* (2013.01);
(Continued)

(58) Field of Classification Search
CPC ......................... H01L 21/046; H01L 29/1095
See application file for complete search history.

(56) References Cited

U.S. PATENT DOCUMENTS

2005/0263853 A1   12/2005   Tomomatsu et al.
2010/0044786 A1   2/2010    Inomata et al.
(Continued)

FOREIGN PATENT DOCUMENTS

JP   2005-347289 A   12/2005
JP   2006-19553 A    1/2006
(Continued)

OTHER PUBLICATIONS

International Search Report dated Aug. 15, 2017 in PCT/JP2017/020812 filed Jun. 5, 2017.

*Primary Examiner* — Thomas L Dickey
(74) *Attorney, Agent, or Firm* — Oblon, McClelland, Maier & Neustadt, L.L.P.

(57) ABSTRACT

A semiconductor device includes an emitter region, a base contact region, a buried region, and a carrier trap region. The emitter region and the base contact region are selectively disposed in the upper surface of the base region while being adjacent to each other. The buried region is disposed in the drift region below the base contact region or the emitter region. The carrier trap region is disposed between the buried region and the base region, and has a carrier lifetime shorter than that of the drift region. The device can improve latch-up breakdown tolerance.

10 Claims, 15 Drawing Sheets

(51) Int. Cl.
*H01L 29/12* (2006.01)
*H01L 29/78* (2006.01)
*H01L 29/739* (2006.01)
*H01L 21/04* (2006.01)
*H01L 29/16* (2006.01)
*H01L 29/66* (2006.01)

(52) U.S. Cl.
CPC .......... *H01L 29/12* (2013.01); *H01L 29/1608* (2013.01); *H01L 29/66068* (2013.01); *H01L 29/739* (2013.01); *H01L 29/7393* (2013.01); *H01L 29/78* (2013.01)

(56) References Cited

U.S. PATENT DOCUMENTS

2010/0140628 A1    6/2010  Zhang
2016/0260807 A1*  9/2016  Soeno ................. H01L 27/0629
2016/0336390 A1* 11/2016  Hamada ............ H01L 29/66068

FOREIGN PATENT DOCUMENTS

| JP | 2008-211178 A | 9/2008 |
|---|---|---|
| JP | 2010-50161 A | 3/2010 |
| WO | WO-2015129430 A1 * | 9/2015 |

* cited by examiner

F I G . 1
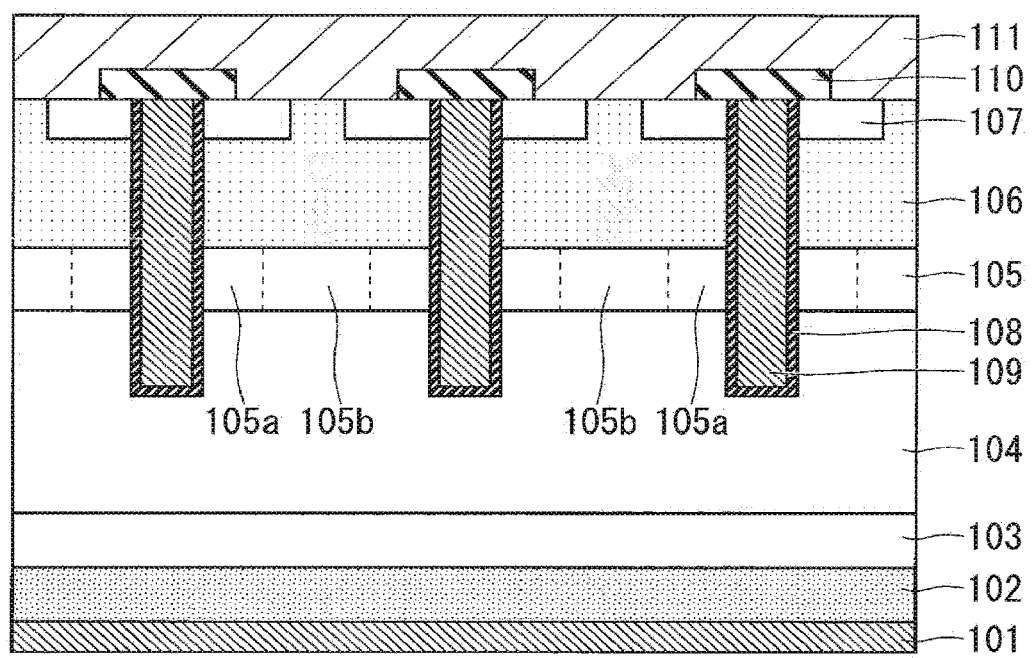
F I G . 2
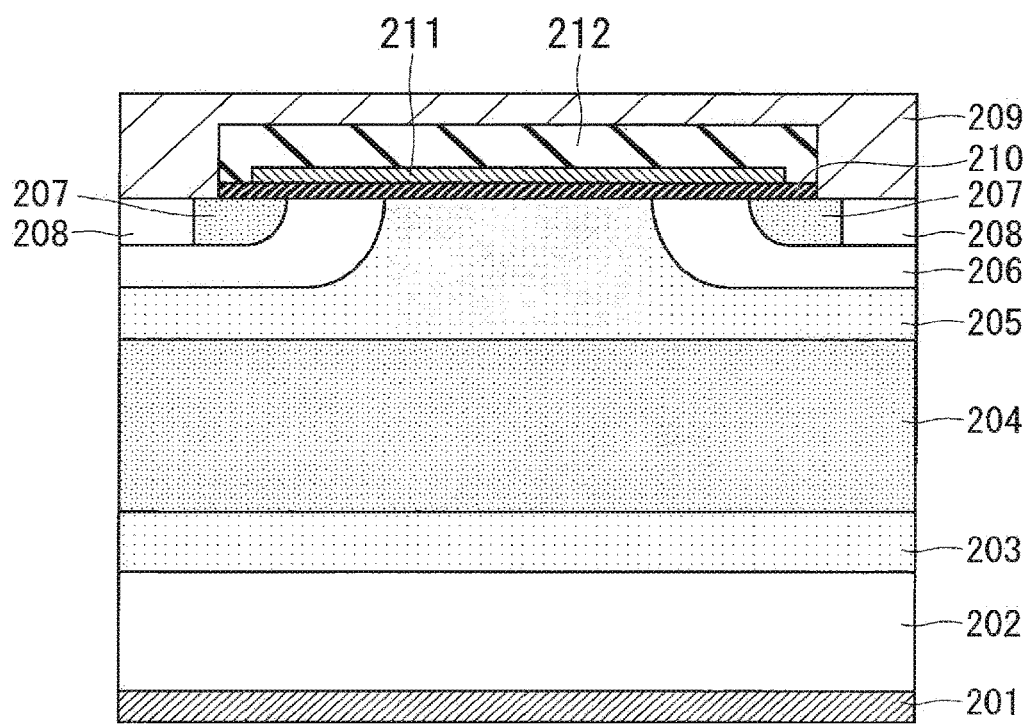

F I G . 3
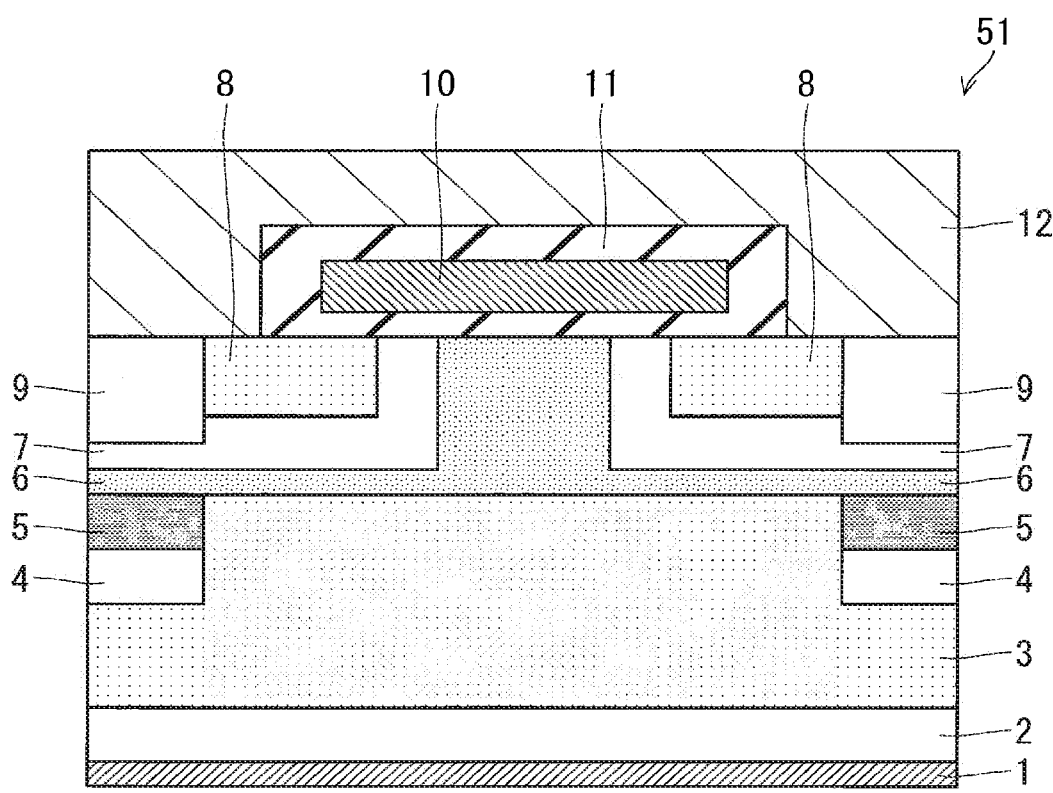

F I G . 4
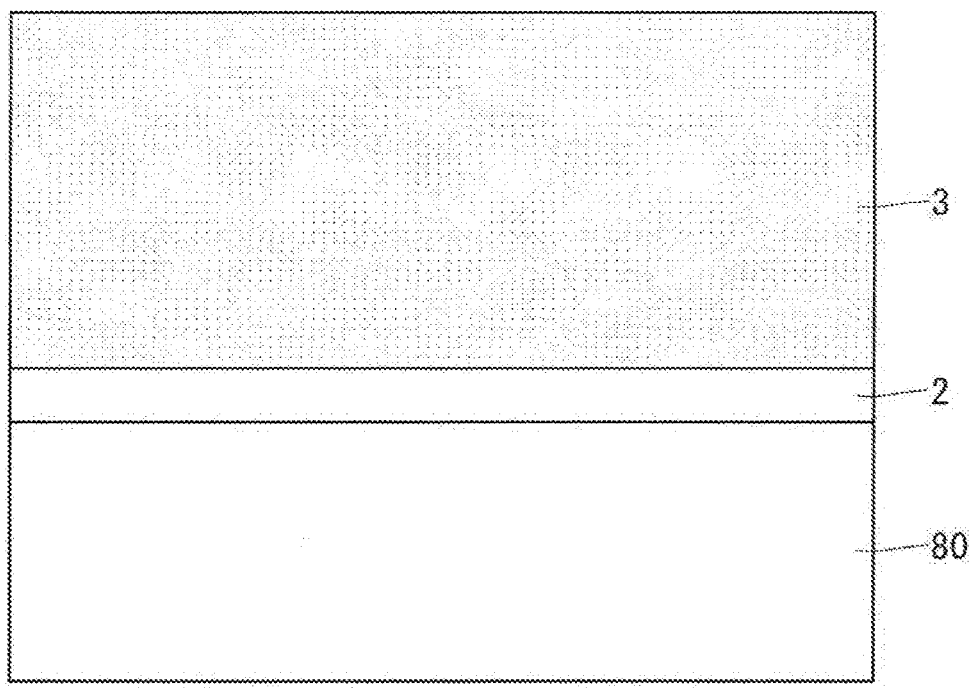
F I G . 5
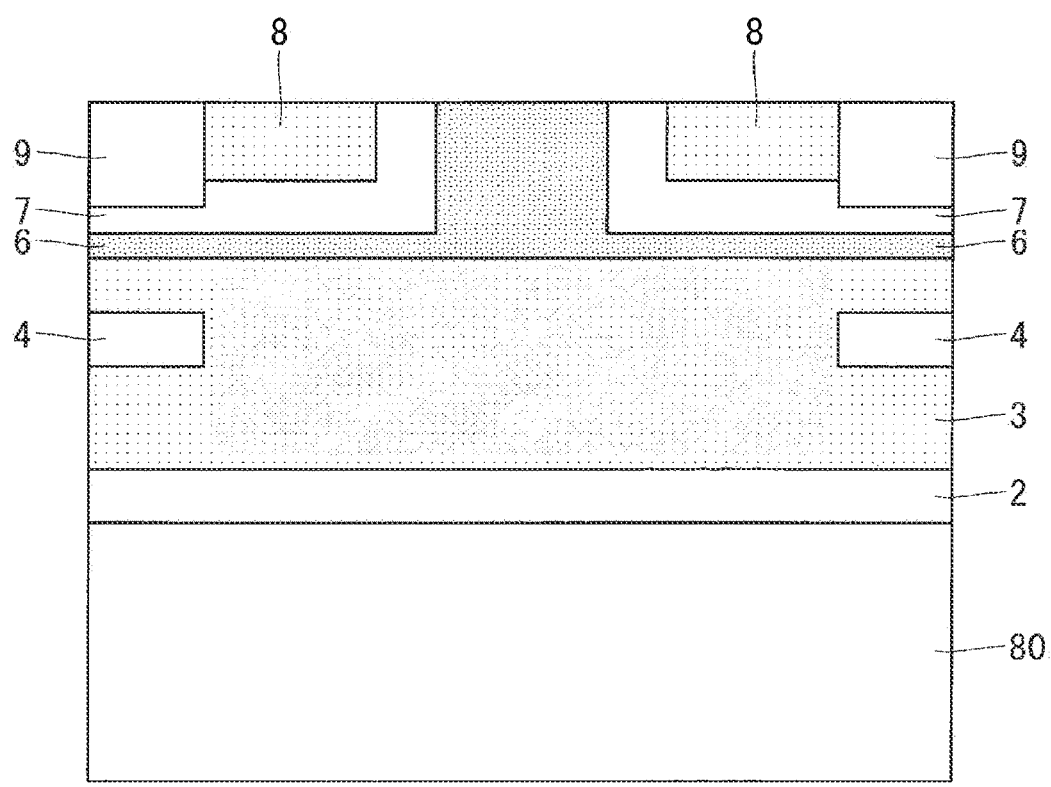

F I G . 6
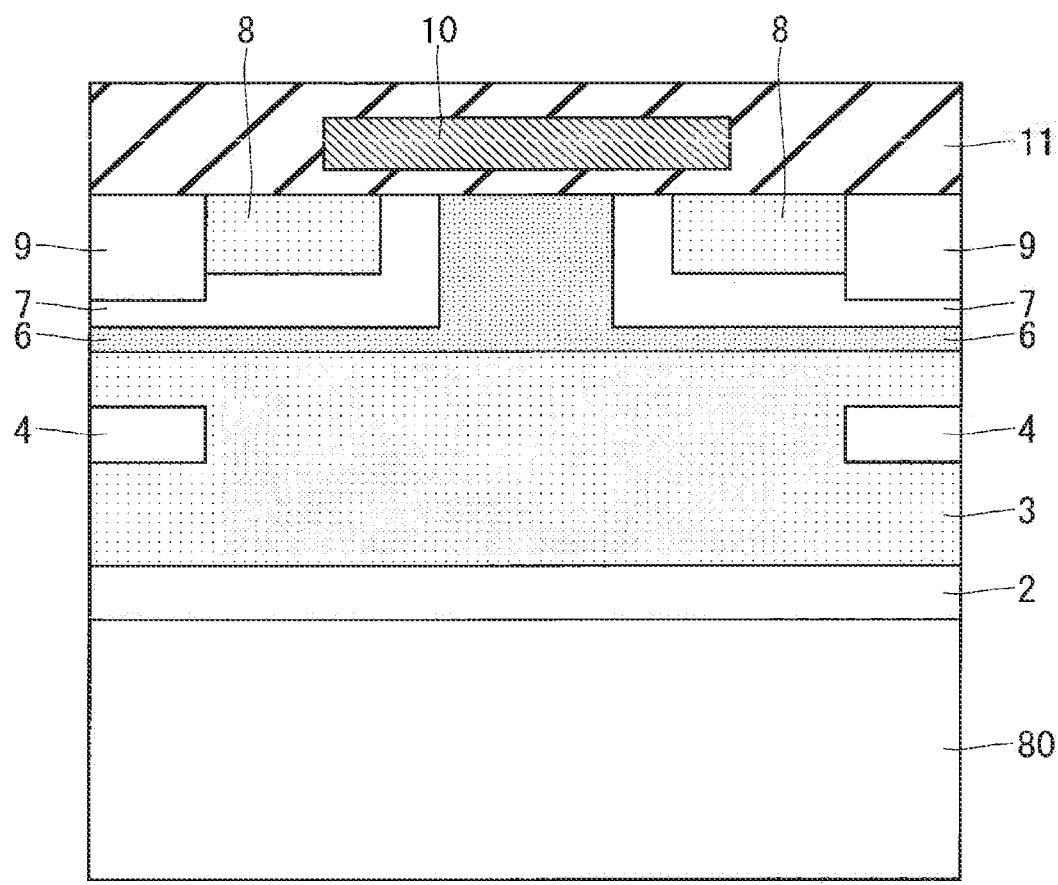

F I G . 7
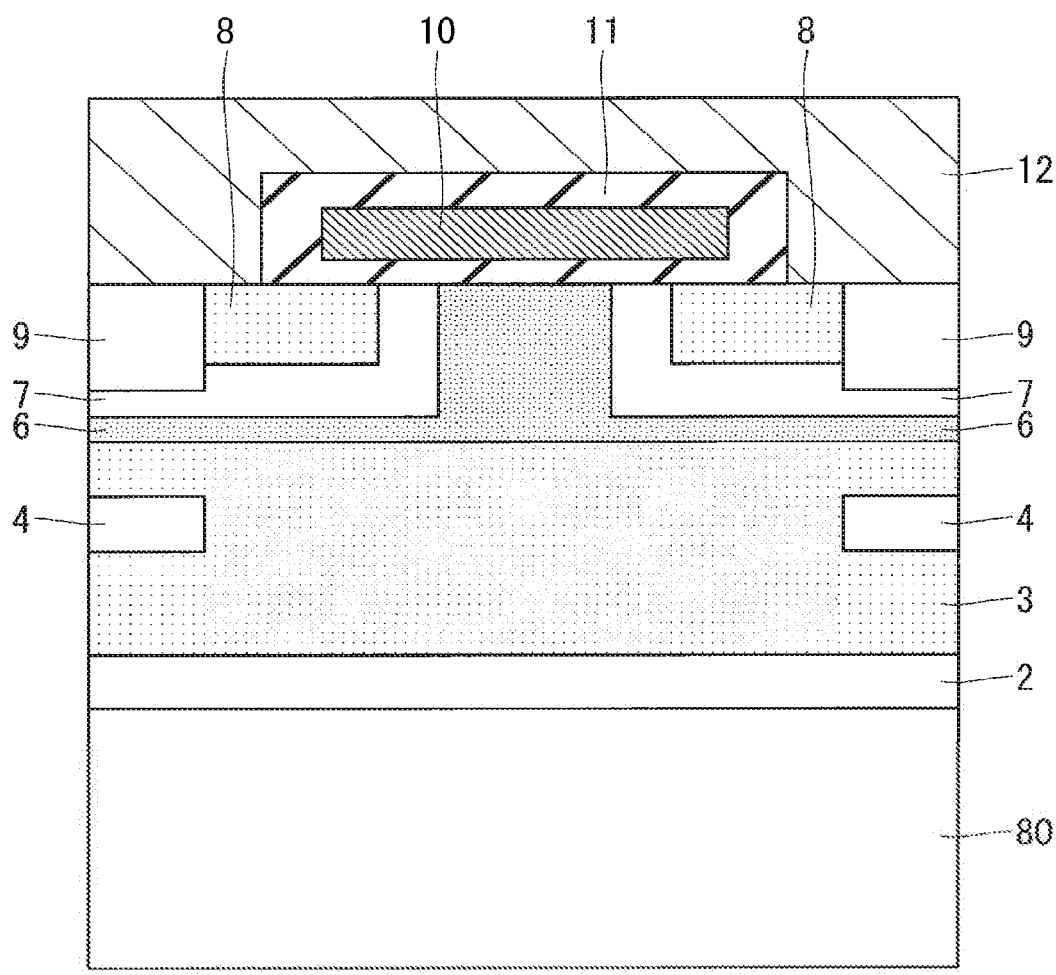

F I G . 8
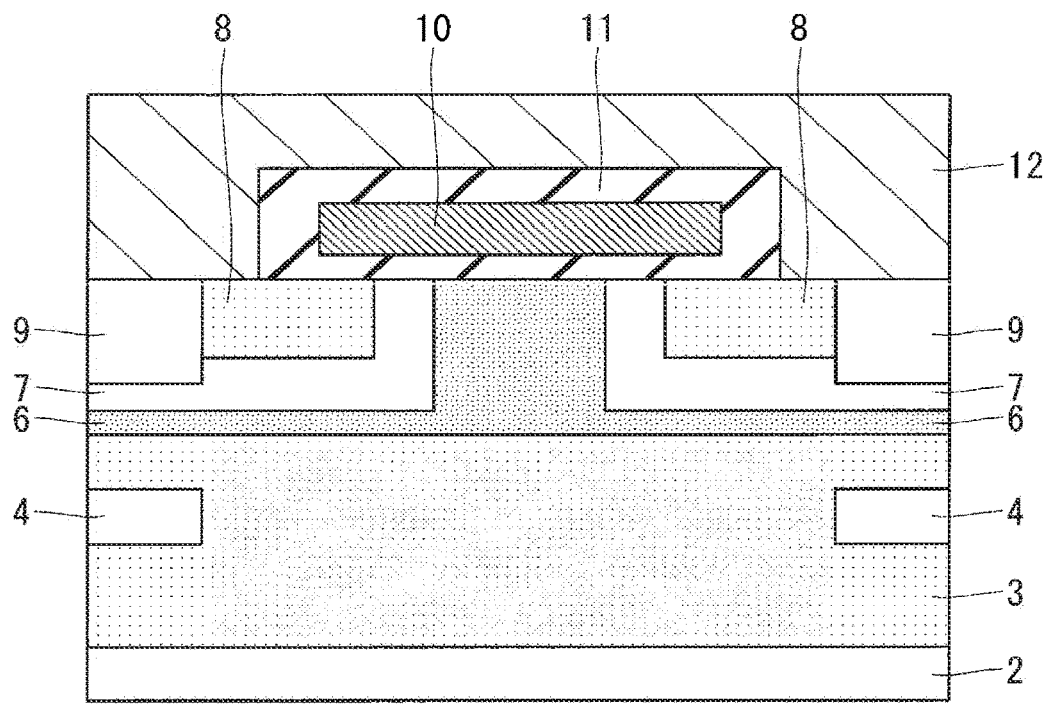
F I G . 9
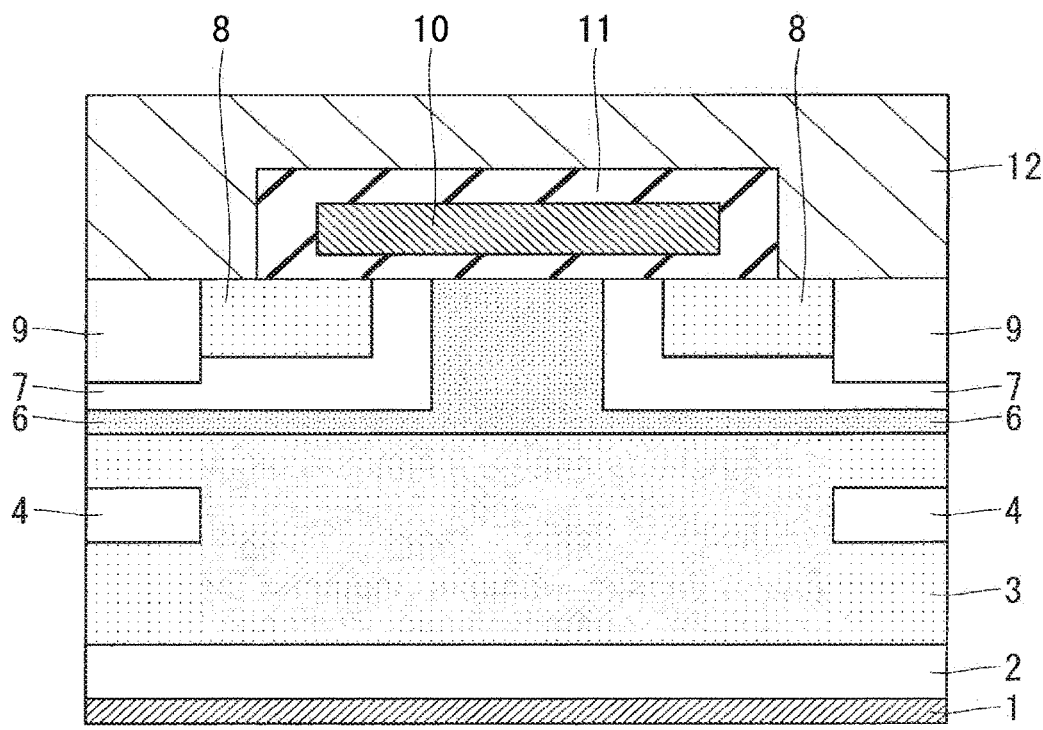

F I G . 1 2
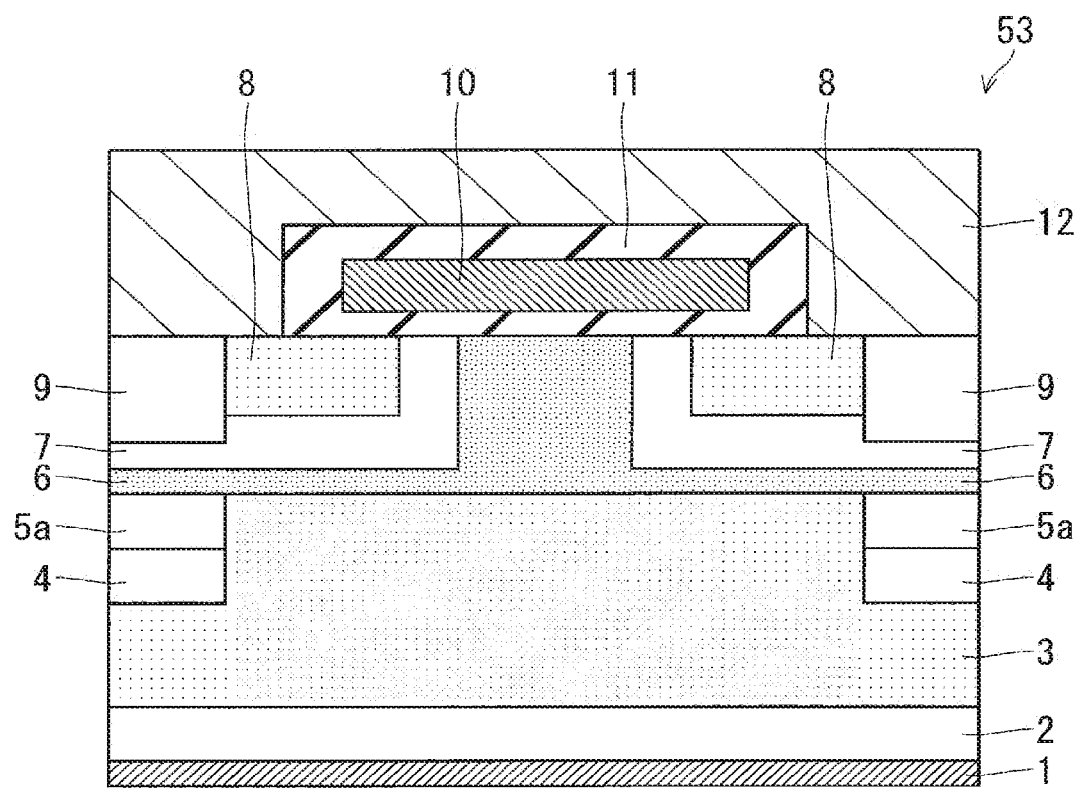

F I G . 1 3
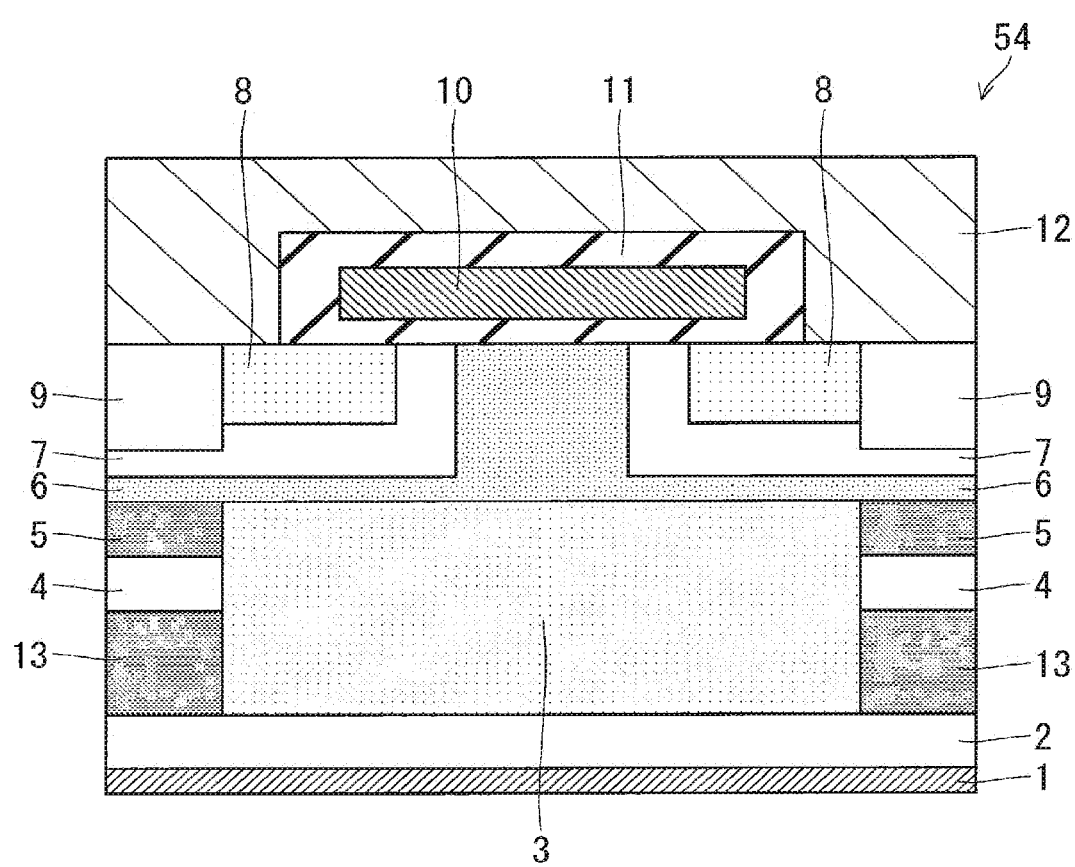

F I G 1 5
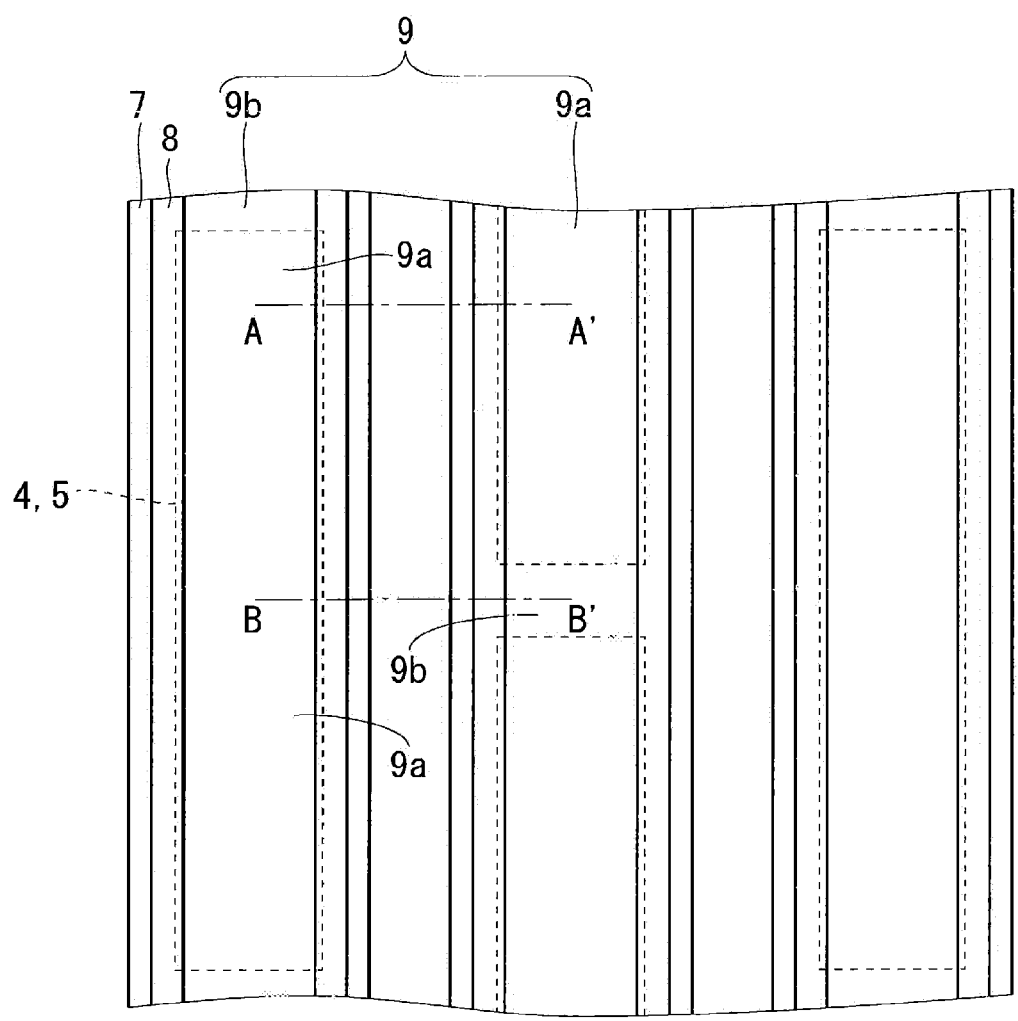

CROSS SECTION TAKEN ALONG LINE A-A'

CROSS SECTION TAKEN ALONG LINE B-B'

CROSS SECTION TAKEN ALONG LINE C-C'

CROSS SECTION TAKEN ALONG LINE D-D'

SEMICONDUCTOR DEVICE, AND MANUFACTURING METHOD FOR SAME

TECHNICAL FIELD

The present invention relates to a semiconductor device and a method for manufacturing the semiconductor device.

BACKGROUND ART

An insulated gate bipolar transistor (hereinafter referred to as "IGBT") using silicon (Si) or silicon carbide (SiC) as a semiconductor material is known.

In the IGBT, various techniques have been proposed in order to reduce the resistance during the ON state, that is, the on-resistance. For example, in the technique of Patent Document 1, forming a carrier accumulation region for carrier accumulation reduces the on-resistance. In addition, for example, in the technique of Patent Document 2, forming a current suppressing layer reduces the on-resistance.

PRIOR ART DOCUMENTS

Patent Documents

Patent Document 1: Japanese Patent Application Laid-Open No. 2005-347289
Patent Document 2: Japanese Patent Application Laid-Open No. 2008-211178

SUMMARY

Problem to be Solved by the Invention

According to the techniques of Patent Documents 1 and 2, although the on-resistance of the IGBT can be reduced, there is a problem that the latch-up breakdown tolerance decreases. It should be noted that the latch up means a state where when a voltage not less than the power supply voltage or a negative voltage is applied to an input or output terminal of an integrated circuit (IC) or an IGBT, a pnpn structure present in the device operates as a parasitic thyristor, and the current continues to flow until the power supply is turned off.

Specifically, in the parasitic thyristor of the pnpn structure including a collector layer, a drift layer, a base layer, and an emitter layer in the IGBT, the electrons accumulated in the drift layer flow to the collector electrode and the holes flow to the emitter electrode during the OFF operation of the IGBT. In this case, even if the passage of electrons formed by the gate voltage, that is, the channel is blocked by lowering the gate voltage, most of the collector current continues to flow to the pnpn structure being a parasitic thyristor.

As a result, the IGBT may operate at a large current, a high voltage, a high temperature state or the like exceeding the rating. In other words, there is an anticipated possibility that unless the power is turned off, heat generated due to a large current leads to destruction referred to as latch-up breakdown. As described above, since leading to malfunction or destruction of the device, occurrence of latch-up is inconvenient for IC and IGBT. In particular, it is anticipated that this problem becomes conspicuous in a structure including a carrier accumulation region and a current suppressing layer for reducing the on-resistance, as disclosed in Patent Documents 1 and 2.

Thus, the present invention has been made in view of the above-described problem, and has an object to provide a technique capable of improving latch-up breakdown tolerance.

Means to Solve the Problem

The semiconductor device according to the present invention includes: a collector electrode; a collector region of a first conductivity type disposed on the collector electrode; a drift region of a second conductivity type disposed on the collector region; a carrier accumulation region of the second conductivity type disposed on the drift region, the carrier accumulation region having an impurity concentration higher than an impurity concentration of the drift region; a base region of a first conductivity type selectively disposed in an upper surface of the carrier accumulation region; an emitter region of the second conductivity type and a base contact region of a first conductivity type adjacent to each other, selectively disposed in an upper surface of the base region; a gate electrode capable of forming a channel in the base region; an emitter electrode connected to the emitter region and the base contact region; a buried region of a first conductivity type disposed in the drift region below the base contact region or the emitter region; and a carrier trap region disposed between the buried region and the base region, the carrier trap region having a carrier lifetime shorter than a carrier lifetime of the drift region.

Effects of the Invention

According to the present invention, a buried region disposed in a drift region below the base contact region or the emitter region, and a carrier trap region disposed between the buried region and the base region and having a carrier lifetime shorter than that of the drift region are included. This allows the latch-up breakdown tolerance to be improved.

The objects, features, aspects, and advantages of the present invention will become more apparent from the following detailed description and the accompanying drawings.

BRIEF DESCRIPTION OF DRAWINGS

FIG. 1 is a cross-sectional view showing a configuration of a first related semiconductor device.
FIG. 2 is a cross-sectional view showing a configuration of a second related semiconductor device.
FIG. 3 is a cross-sectional view showing a configuration of a semiconductor device according to a first embodiment.
FIG. 4 is a process cross-sectional view for illustrating a method for manufacturing the semiconductor device according to the first embodiment.
FIG. 5 is a process cross-sectional view for illustrating a method for manufacturing the semiconductor device according to the first embodiment.
FIG. 6 is a process cross-sectional view for illustrating a method for manufacturing the semiconductor device according to the first embodiment.
FIG. 7 is a process cross-sectional view for illustrating a method for manufacturing the semiconductor device according to the first embodiment.
FIG. 8 is a process cross-sectional view for illustrating a method for manufacturing the semiconductor device according to the first embodiment.

FIG. 9 is a process cross-sectional view for illustrating a method for manufacturing the semiconductor device according to the first embodiment.

FIG. 12 is a cross-sectional view showing a configuration of a semiconductor device according to a third embodiment.

FIG. 13 is a cross-sectional view showing a configuration of a semiconductor device according to a fourth embodiment.

FIG. 15 is a plan view showing a configuration of the semiconductor device according to the fifth embodiment.

DESCRIPTION OF EMBODIMENTS

Figure 10:
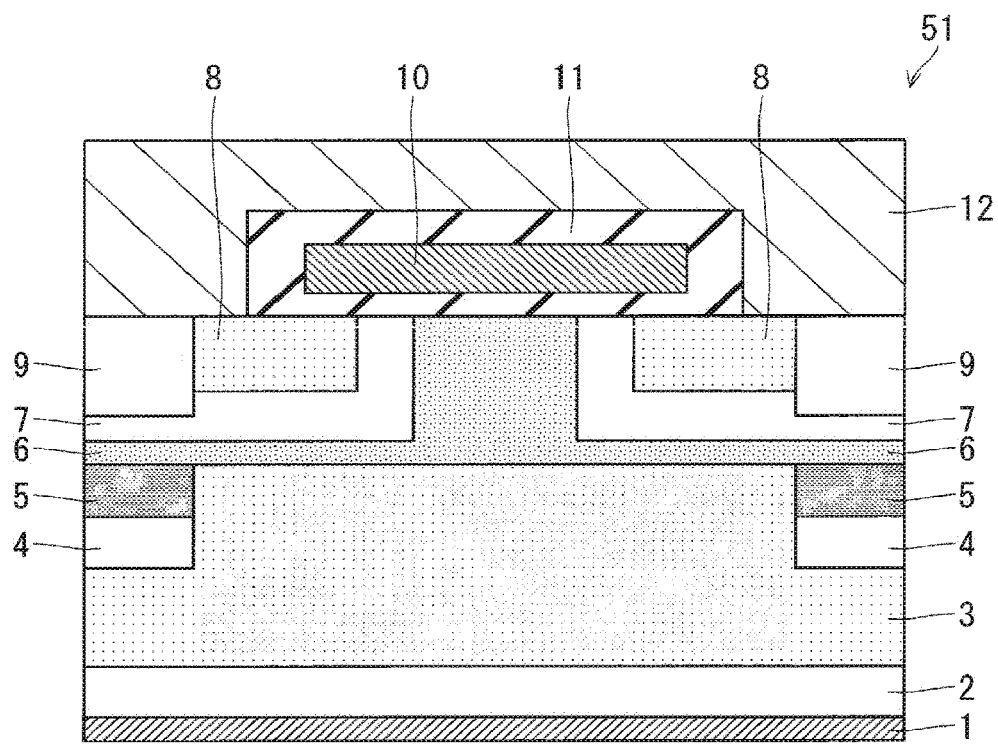
FIG. 10 is a process cross-sectional view for illustrating a method for manufacturing the semiconductor device according to the first embodiment.

Hereinafter, embodiments will be described with reference to the accompanying drawings. It should be noted that the drawings are shown schematically, and the mutual relationship between the sizes and positions of the respective components shown in the different drawings is not necessarily described accurately and can be appropriately changed. In addition, the direction of up, down, left, or right in the following description is a direction for convenience of description and may differ from the actual direction.

First, before describing the semiconductor device and the manufacturing method therefor according to the first embodiment of the present invention, first and second semiconductor devices (hereinafter referred to as "first and second related semiconductor devices") related thereto will be described.

<First Related Semiconductor Device>

FIG. 1 is a cross-sectional view showing a configuration of a first related semiconductor device. This first related semiconductor device is a trench gate type IGBT. Specifically, the first related semiconductor device is a carrier accumulation type trench gate type IGBT including a carrier accumulation region for carrier accumulation.

The first related semiconductor device includes a collector electrode 101; a p-type substrate 102 disposed on the collector electrode 101; an n$^+$-type buffer layer 103 disposed on the substrate 102; and an n$^-$-type semiconductor layer 104 disposed on the buffer layer 103.

In addition, the first related semiconductor device includes a carrier accumulation region 105 disposed on the semiconductor layer 104; the carrier accumulation region 105 including first and second carrier accumulation regions 105a and 105b; a p-type base region 106 disposed on the carrier accumulation region 105; and an n$^+$-type emitter region 107 selectively disposed in the upper surface of the base region 106.

In addition, the first related semiconductor device includes a gate oxide film 108 and a gate electrode 109 disposed in a trench provided from the emitter region 107 to the top of the buffer layer 103; an interlayer insulating film 110 disposed on the gate electrode 109; and an emitter electrode 111 disposed on the interlayer insulating film 110 and connected to the emitter region 107.

In the first related semiconductor device configured as described above, when a predetermined gate voltage $V_{GE}$ is applied between the emitter electrode 111 and the gate electrode 109 with a predetermined positive collector voltage $V_{CE}$ applied between the emitter electrode 111 and the collector electrode 101, the gate is turned on. At this time, a channel region being a region near the gate electrode 109 in the base region 106 is inverted, from the p-type to the n-type to form a channel, and electrons are injected from the emitter electrode 111 into the n$^-$-type semiconductor layer 104 through this channel and the emitter region 107.

The injected electrons make the space between the p-type substrate 102 as a collector and the n$^-$-type semiconductor layer 104 into a forward bias state, and holes are injected from the substrate 102 into the semiconductor layer 104. Thus, the resistance of the semiconductor layer 104 is greatly lowered, and the on-resistance of the IGBT is greatly lowered. That is, injecting holes from the substrate 102 lowers the resistance of the semiconductor layer 104. Furthermore, the carrier accumulation region 105 for carrier accumulation disposed under the base region 106 prevents holes from the substrate 102 from reaching the emitter electrode 111, and accumulating holes in the carrier accumulation region 105 allows the on-resistance to be further reduced.

<Second Related Semiconductor Device>

FIG. 2 a cross-sectional view showing a configuration of a second related semiconductor device. This second related semiconductor device is a planar gate type IGBT.

The second related semiconductor device includes a collector electrode 201; an n$^+$-type 4H—SiC substrate 202 disposed on the collector electrode 201; a p-type buffer layer 203 disposed on the SiC substrate 202; and a p$^-$-type drift layer 204 disposed on the buffer layer 203.

In addition, the second related semiconductor device includes a p-type current suppressing layer 205 disposed on the drift layer 204; an n$^+$-type base region 206 selectively disposed in the upper surface of the current suppressing layer 205; and a p$^+$-type emitter region 207 and an n$^+$-type base contact region 208 adjacent to each other, selectively disposed in the upper surface of the base region 206.

In addition, the second related semiconductor device includes an emitter electrode 209 connected to the emitter region 207 and the base contact region 208; a gate electrode 211 disposed over the base region 206 via a first gate insulating film 210; and a second gate insulating film 212 for covering the gate electrode 211.

In the second related semiconductor device configured as described above, when a gate voltage is applied to the gate electrode 211, a channel region being a region near the gate electrode 211 in the base region 206 is inverted from the n-type to the p-type to form a channel. In addition, the p-type current suppressing layer 205 suppresses current conduction in the bipolar junction transistor formed by the n$^+$-type base region 206, the p-type drift layer 204, and the n$^+$-type SiC substrate 202. Thus, accumulation of holes is promoted under the above-described channel region. As a result, the carrier distribution of the IGBT device approaches the carrier distribution in the ON state of the PiN diode, so that the on-resistance of the IGBT can be reduced.

By the way, according to the first and second related semiconductor devices, the on-resistance of the IGBT can be reduced as described above. However, since the first and second related semiconductor devices have a pnpn structure, there arises a problem that the latch-up breakdown tolerance decreases. On the other hand, according to the semiconductor device of the first embodiment, the latch-up breakdown tolerance can be improved.

First Embodiment

FIG. 3 is a cross-sectional view showing a configuration of a semiconductor device 51 according to a first embodiment. The semiconductor device 51 is a planar gate type SiC-IGBT using silicon carbide (SiC) as a semiconductor material. It should be noted that since the semiconductor device 51 uses silicon carbide as a semiconductor material, the semiconductor device 51 can operate stably even at a high temperature.

The semiconductor device 51 includes: a collector electrode 1, a collector region 2 of a first conductivity type, a drift region 3 of a second conductivity type, a buried region 4 of the first conductivity type, a carrier trap region 5 of the second conductivity type, a carrier accumulation region 6 of the second conductivity type, a base region 7 of the first conductivity type, an emitter region 8 of the second conductivity type, a base contact region 9 of the first conductivity type, a gate electrode 10, a gate oxide film 11, and an emitter electrode 12. It should be noted that in the first embodiment, it is described that the first conductivity type is a p-type and the second conductivity type is an n-type, but they may be opposite to each other.

The collector region 2 is disposed on the collector electrode 1 and the drift region 3 is disposed on the collector region 2. The impurity concentration of the drift region 3 is lower than the impurity concentration of the collector region 2. For example, it is desirable that the impurity concentrations of the collector region 2 and the drift region 3 are respectively within the range of $1 \times 10^{18}$ cm$^{-3}$ to $1 \times 10^{21}$ cm$^{-3}$ and $1 \times 10^{12}$ cm$^{-3}$ to $1 \times 10^{15}$ cm$^{-3}$. In addition, the thicknesses, that is, the largest lengths in the vertical direction of the collector region 2 and the drift region 3, are desirably respectively within the range of 2 μm to 100 μm and 50 μm to 300 μm. It should be noted that a buffer layer of the first conductivity type or the second conductivity type (not shown) having a higher impurity concentration than the drift region 3 may be disposed between the collector region 2 and the drift region 3.

Before the buried region 4 and the carrier trap region 5 are described, the carrier accumulation region 6 and the like will be described. The carrier accumulation region 6 is a region disposed on the drift region 3, the region having a higher impurity concentration than the drift region 3. It should be noted that the impurity concentration of the carrier accumulation region 6 is desirably within the range of $1 \times 10^{15}$ cm$^{-3}$ to $1 \times 10^{17}$ cm$^{-3}$. The thickness of the carrier accumulation region 6 is desirably within the range of 1 μm to 10 μm.

The base region 7 is selectively disposed in the upper surface of the carrier accumulation region 6. The emitter region 8 and the base contact region 9 adjacent to each other are selectively disposed in the upper surface of the base region 7.

The gate electrode 10 is disposed over the base region 7 via the gate insulating film 11. With this configuration, the gate electrode 10 can form a channel in the base region 7. It should be noted that in the first embodiment, the gate insulating film 11 also includes a portion that covers the gate electrode 10.

The emitter electrode 12 is disposed on the gate insulating film 11 and connected to the emitter region 8 and the base contact region 9 in the hole of the gate insulating film 11. Then, a part of the emitter electrode 12 is disposed on the emitter region 8 and the base contact region 9.

Next, the buried region 4 and the carrier trap region 5 will be described.

The buried region 4 is disposed in the drift region 3 below the base contact region 9, and is disposed away from the carrier accumulation region 6. It should be noted that the impurity concentration of the buried region 4 is desirably within the range of $1 \times 10^{16}$ cm$^{-3}$ to $1 \times 10^{19}$ cm$^{-3}$. The width of the buried region 4, that is, the length in the horizontal direction is desirably not less than the width of the base contact region 9, and for example, is desirably within the range of 1 μm to 10 μm. Then, the end portion in the horizontal direction of the buried region 4 is desirably positioned on the outer side in the horizontal direction of the base contact region 9 with respect to the end portion in the horizontal direction of the base contact region 9, that is, on the center side in FIG. 3. In addition, the thickness of the buried region 4 is desirably within the range of 0.5 μm to 5 μm.

The carrier trap region 5 is disposed between the buried region 4 and the base region 7. In the first embodiment, since the carrier trap region 5 is disposed between the buried region 4 and the carrier accumulation region 6, the carrier trap region 5 and the carrier accumulation region 6 are disposed between the buried region 4 and the base region 7.

Here, the "carrier trap" refers to trapping carriers such as electrons and holes which contribute to the electrical characteristics of the IGBT, and more specifically, indicates that the carrier lifetime is short. Here, the carrier lifetime of the carrier trap region 5 is shorter than the carrier lifetime of the drift region 3. It should be noted that the carrier lifetimes of the carrier trap region 5 and the drift region 3 can be adjusted, for example, by causing defects in the semiconductor, and are desirably respectively in the range of 1 ns to 1 μs and 1 μs to 1 ms. The thickness of the carrier trap region 5 is desirably in, the range of 0.5 μm to 5 μm. In addition, the end portion in the horizontal direction of the carrier trap region 5 is desirably positioned on the outer side in the horizontal direction of the buried region 4 with respect to the end portion in the horizontal direction of the buried region 4, that is, on the center side in FIG. 3.

<Manufacturing Method>

Next, a manufacturing method of the semiconductor device 51 according to the first embodiment, which is a planar gate type SiC-IGBT, will be described with reference to process cross-sectional views shown in FIGS. 4 to 10. First, as shown in FIG. 4, a collector region 2 is formed on a second conductivity type SiC substrate 80 by epitaxial growth, and then a drift region 3 is formed on the collector region 2 by epitaxial growth. At this time, a buffer layer of the first conductivity type or the second conductivity type (not shown) having a higher impurity concentration than the drift region 3 may be formed between the collector region 2 and the drift region 3.

Next, ion implantation treatment and heat treatment for activating the implanted ions is performed on a predetermined region of the drift region 3. Performing a series of the processing a plurality of times selectively forms the buried region 4, the carrier accumulation region 6, the base region 7, the emitter region 8, and the base contact region 9 in a plurality of regions in the drift region 3 as shown in FIG. 5. The ion implantation treatment may be performed with a single implantation energy or may be performed while gradually changing the implantation energy, for example, from high to low. In addition, the ion implantation treatment is performed via an implantation mask in order to perform ion implantation on a predetermined region. As the implantation mask, for example, a photoresist or oxide film for photoengraving is used. The implanted surface density during the ion implantation treatment is desirably within the range of $1 \times 10^{13}$ cm$^{-2}$ to $1 \times 10^{16}$ cm$^{-2}$, and the implantation energy is desirably within the range of 10 keV to 10 MeV. In addition, the temperature of the SiC substrate 80 during the ion implantation treatment is desirably within the range of 10° C. to 1000° C.

The impurity concentrations of the buried region 4 and the carrier accumulation region 6 are desirably respectively within $1 \times 10^{16}$ cm$^{-3}$ to $1 \times 10^{19}$ cm$^{-3}$ and $1 \times 10^{15}$ cm$^{-3}$ to $1 \times 10^{17}$ cm$^{-3}$. In addition, the impurity concentrations of the base region 7, the emitter region 8, and the base contact region 9 are desirably respectively within the range of $1 \times 10^{17}$ cm$^{-3}$ to $1 \times 10^{19}$ cm$^{-3}$, $1 \times 10^{18}$ cm$^{-3}$ to $1 \times 10^{20}$ cm$^{-3}$, and $1 \times 10^{19}$ cm$^{-3}$ to $1 \times 10^{21}$ cm$^{-3}$.

The thicknesses of the buried region 4 and the carrier accumulation region 6 are desirably respectively within the range of 0.5 μm to 5 μm and 1 μm to 10 μm. In addition, the thicknesses of the base region 7, the emitter region 8, and the base contact region 9 are desirably respectively within the range of 0.5 μm to 3 μm, 0.2 μm to 1 μm, and 0.2 μm to 1 μm.

Examples of the dopant atoms used for the above ion implantation treatment include aluminum, boron, phosphorus, and nitrogen. The temperature of the heat treatment for activating the implanted ions is desirably within the range of 1500° C. to 2000° C. It should be noted that methods of forming the buried region 4, the carrier accumulation region 6, the base region 7, the emitter region 8, and the base contact region 9 by ion implantation are described in the first embodiment, but some or all of these may be formed by epitaxial growth and etching techniques.

Next, thermally oxidizing the upper portions of the carrier accumulation region 6, the base region 7, the emitter region 8, and the base contact region 9 in an oxygen atmosphere forms a gate oxide film. The thickness of the gate oxide film is desirably within the range of, for example, 10 nm to 100 nm. Subsequently, a gate electrode 10 is formed as a deposited film on the upper side of the gate oxide film. As the material of the gate electrode 10, for example, poly-Si is used. Thereafter, a gate insulating film 11 for electrically isolating the gate electrode 10 is formed so as to cover the gate electrode 10. Thus, as shown in FIG. 6, the gate electrode 10 is formed over the base region 7 via the gate insulating film 11. It should be noted that in the first embodiment, a thermal oxide film of SiC is used as the gate oxide film, but various deposited films may be used.

Next, as shown in FIG. 7, a hole is opened in a portion over the emitter region 8 and the base contact region 9 of the gate insulating film 11, and then an emitter electrode 12 in ohmic contact with the emitter region 8 and the base contact region 9 is formed. Thus, the emitter electrode 12 insulated from the gate electrode 10 by the gate insulating film 11 and connected to the emitter region 8 and the base contact region 9 is formed. For the emitter electrode 12, for example, aluminum, titanium, nickel, gold, silver, copper, or the like is used, and the emitter electrode 12 is formed by an electron beam evaporation method or a sputtering method.

Next, processing by back grinding, chemical mechanical polishing (CMP), or other methods is performed on the lower surface of the SiC substrate 80. Thus, as shown in FIG. 8, the SiC substrate 80 is removed and the collector region 2 is exposed. The thickness of the collector region 2 may be the same or different before and after the processing.

Next, as shown in FIG. 9, a collector electrode 1 is formed under the exposed collector region 2. That is, the collector electrode 1 is formed on the side opposite to the emitter electrode 12. For the collector electrode 1, for example, aluminum, titanium, nickel, gold, silver, copper, or the like is used, and the collector electrode 1 is formed by an electron beam evaporation method or a sputtering method. The collector electrode 1 is in ohmic contact with the collector region 2.

Finally, as shown in FIG. 10, a region other than above or below the region where the carrier trap region 5 is to be formed is covered with an irradiation mask, and electron beam irradiation is performed from the emitter electrode 12 side or the collector electrode 1 side via the irradiation mask. Thus, a point defect is formed, and a carrier trap region 5 is formed between the buried region 4 and the base region 7. As conditions for forming the carrier trap region 5, the irradiation amount of the electron beam is desirably within the range of $1 \times 10^{14}$ cm$^{-2}$ to $1 \times 10^{17}$ cm$^{-2}$, and the irradiation energy is desirably within the range of 10 keV to 1 MeV.

The thickness and the depth in the thickness direction from the substrate surface, of the carrier trap region 5, can be adjusted by appropriately selecting the irradiation energy of the electron beam, and the carrier lifetime of the carrier trap region 5 can be adjusted by appropriately selecting the irradiation amount of the electron beam. It should be noted that in the first embodiment, an example of forming the carrier trap region 5 after forming the emitter electrode 12 and the collector electrode 1 is described, but it is possible to form the carrier trap region 5 at any timing after performing the heat treatment for activating the implanted ions.

In addition, in the first embodiment, an example of after forming the structure from the collector region 2 to the emitter electrode 8 on the SiC substrate 80 with the steps of FIGS. 4 to 7, removing the SiC substrate 80 as shown in FIG. 8, and forming the collector electrode 1 under the collector region 2 exposed by the removal as shown in FIG. 9 is described. However, the present invention is not limited to this, and the timing of removing the SiC substrate 80 can be appropriately changed.

For example, after sequentially forming the collector region 2 and the drift region 3 on the SiC substrate 80 by epitaxial growth, the SiC substrate 80 is removed, and the collector electrode 1 may be formed under the collector region 2 exposed by the removal.

In addition, in the first embodiment, an example of forming the collector region 2 by epitaxial growth is described, but the present invention is not limited thereto. For example, after forming the drift region 3 on the SiC substrate 80 by epitaxial growth, the SiC substrate 80 is removed, and the collector region 2 may be formed by ion implantation into the drift region 3 exposed by the removal. Then, the collector electrode 1 may be formed under the collector region 2.

Summary of First Embodiment

According to the semiconductor device 51 of the first embodiment, the buried region 4 is formed below the base contact region 9. Therefore, when the first conductivity type is the p-type and the second conductivity type is the n-type, holes being minority carriers accumulated in the drift region 3 bypass the buried region 4 preferentially and reach the base contact region 9 during the off operation of the SiC-IGBT. This is because the buried region 4 has the first conductivity type different from the second conductivity type of the drift region 3 and the buried region 4 has lower resistance than the drift region 3 for the holes. Therefore, since the holes reaching the emitter region 8 can be reduced, it is possible to prevent the operation of the parasitic thyristor having the pnpn structure including the collector region 2, the drift region 3, the base region 7, and the emitter region 8, and to improve latch-up breakdown tolerance. Furthermore, since the carrier trap region 5 is formed between the base region 7 and the buried region 4, recombination of holes bypassing the buried region 4 is promoted in the carrier trap region 5 during the off operation of the SiC-IGBT. Therefore, the operation of the parasitic thyristor having the pnpn structure including the buried region 4, the carrier accumulation region 6, the base region 7, and the emitter region 8 can be prevented, and the latch-up breakdown tolerance can be improved. In addition, promoting the recombination of holes being minority carriers in the carrier trap region 5 during the off operation of the SiC-IGBT allows switching loss, that is, turn-off loss to be also reduced.

It should be noted that the carrier trap region 5 may be formed only on the buried region 4 and eventually only below the base contact region 9. With this configuration, the influence on the conductivity modulation of the drift region 3 that occurs during the on operation of the SiC-IGBT can be made extremely small, and the increase in the on-resistance can be made extremely small.

In addition, the impurity concentration of the second conductivity type of the carrier trap region 5 may be made higher than the impurity concentration of the second conductivity type of the drift region 3. In this case, the impurity concentration of the second conductivity type is desirably within the range of $1 \times 10^{15}$ cm$^{-3}$ to $1 \times 10^{21}$ cm$^{-3}$. With this configuration, accumulation of holes in the drift region 3 can be promoted during the on operation of the SiC-IGBT, and the on-resistance can be further reduced. Therefore, according to this configuration, it is possible to further improve the latch-up breakdown tolerance while further reducing the on-resistance.

Second Embodiment

Figure 11:
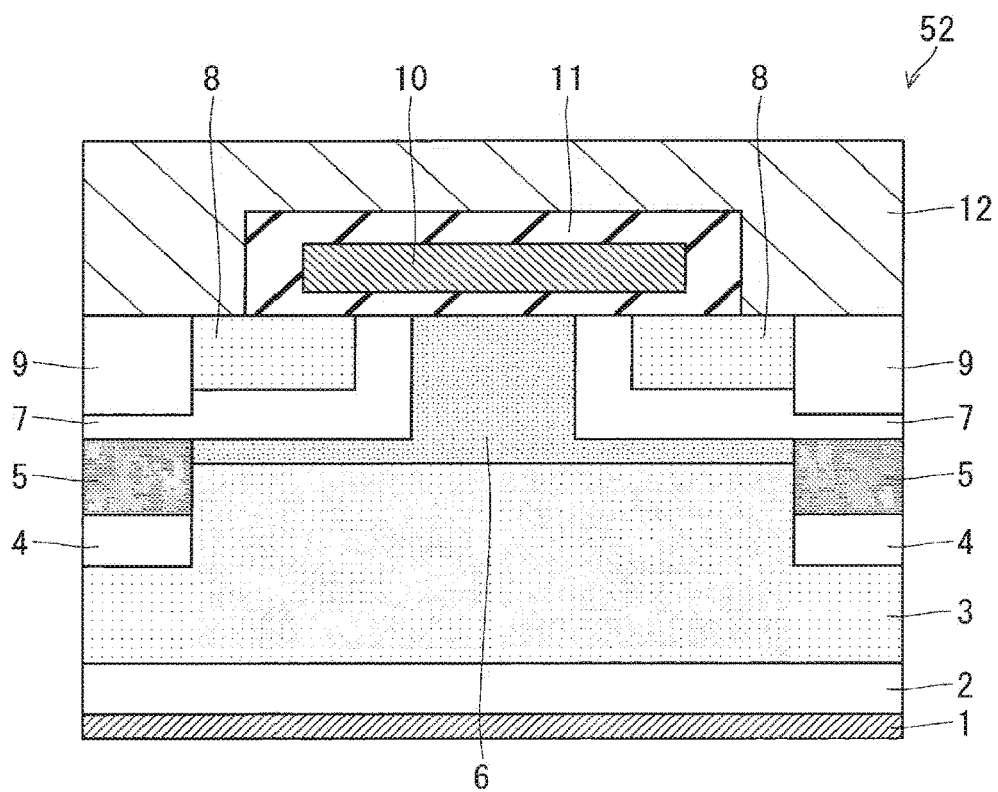
FIG. 11 is a cross-sectional view showing a configuration of a semiconductor device according to a second embodiment.

As in the first embodiment, the semiconductor device according to the second embodiment of the present invention will be described with, a planar gate type SiC-IGBT using silicon carbide (SiC) as a semiconductor material as an example. FIG. 11 is a cross-sectional view showing a configuration of a semiconductor device 52 according to a second embodiment. The semiconductor device 52 according to the second embodiment differs from the semiconductor device 51 in FIG. 3 described in the first embodiment in that the carrier accumulation region 6 is not disposed below the base contact region 9, and the carrier trap region 5 is connected to the base region 7.

According to the semiconductor device 52 described in the second embodiment, holes being minority carriers accumulated in the drift region 3 bypass the buried region 4 preferentially and reach the base contact region 9 during the off operation of the SiC-IGBT. At this time, the holes directly reach the base region 7 without bypassing the carrier accumulation region 6. Therefore, as compared with the semiconductor device 51 described in the first embodiment, the resistance from the buried region 4 to the base region 7 becomes low resistance for holes. Therefore, since holes reaching the emitter region 8 can be further reduced, the latch-up breakdown tolerance can be improved.

Third Embodiment

As in the first embodiment, the semiconductor device according to the third embodiment of the present invention will be described with a planar gate type SiC-IGBT using silicon carbide (SiC) as a semiconductor material as an example. FIG. 12 is a cross-sectional view showing a configuration of a semiconductor device 53 according to the third embodiment. The semiconductor device 53 according to the third embodiment differs from the semiconductor devices 51 and 52 described in the first and second embodiments in that the carrier trap region 5a has the first conductivity type instead of the second conductivity type. That is, the carrier trap region 5a of the first conductivity type is disposed between the buried region 4 and the base region 7. It should be noted that the impurity concentration of the first conductivity type of the carrier trap region 5a is desirably within the range of $1 \times 10^{15}$ cm$^{-3}$ to $1 \times 10^{21}$ cm$^{-3}$.

According to the semiconductor device 53 described in the third embodiment, holes being minority carriers accumulated in the drift region 3 bypass the buried region 4 preferentially and reach the base contact region 9 during the off operation of the SiC-IGBT. At this time, the holes reach the base region 7 via the carrier trap region 5a of the first conductivity type. Therefore, as compared with the semiconductor device 51 described in the first embodiment, the resistance from the buried region 4 to the base region 7 becomes low resistance for holes. Therefore, since holes reaching the emitter region 8 can be further reduced, the latch-up breakdown tolerance improves.

It should be noted that in the above description, the carrier trap region has the first conductivity type or the second conductivity type, but the carrier trap region is not limited to these, and the carrier trap region may include an intrinsic semiconductor having neither the first conductivity type nor the second conductivity type.

Fourth Embodiment

As in the first embodiment, the semiconductor device according to the fourth embodiment of the present invention will be described with a planar gate type SiC-IGBT using silicon carbide (SiC) as a semiconductor material as an example. FIG. 13 is a cross-sectional view showing a configuration of a semiconductor device 54 according to the fourth embodiment. The semiconductor device according to the fourth embodiment differs from the semiconductor devices 51 to 53 described in the first to third embodiments in that a carrier trap reduction region 13 of the second conductivity type having a carrier lifetime longer than that of the drift region 3 is disposed between the buried region 4 and the collector region 2, that is, under the buried region 4.

Here, "the carrier trap is reduced" indicates that a factor (such as a deep level due to a point defect) that traps carriers such as electrons and holes contributing to the electrical characteristics of the IGBT is reduced, and specifically, indicates that the carrier lifetime is long. As described above, the carrier lifetime of the carrier trap reduction region 13 is longer than the carrier lifetime of the drift region 3. It should be noted that the carrier lifetime of the carrier trap reduction region 13 is desirably within the range of 10 μs to 10 ms.

According to the semiconductor device 54 described in the fourth embodiment, the accumulation of holes in the carrier trap reduction region 13 is promoted during the on operation of the SiC-IGBT. Thus, it is possible to increase the holes preferentially bypassing the buried region 4 during the off operation of the SiC-IGBT. Therefore, as compared with the semiconductor devices 51 to 53 described in the first to third embodiments, the on-resistance can be further reduced, and the latch-up breakdown tolerance can be further improved.

Fifth Embodiment

Figure 16:
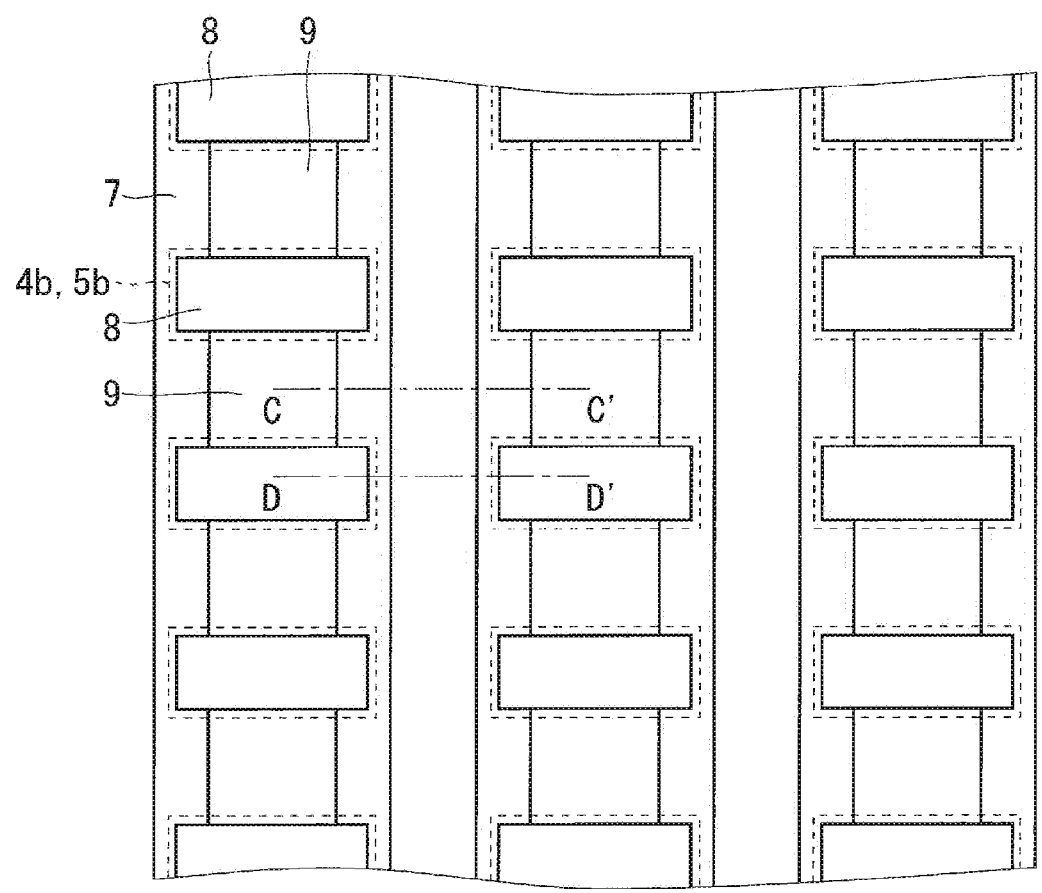
FIG. 16 is a plan view showing a configuration of the semiconductor device according to the fifth embodiment.

As in the first embodiment, the semiconductor device according to the fifth embodiment of the present invention will be described with a planar gate type SiC-IGBT using silicon carbide (SiC) as a semiconductor material as an example. It should be noted that in the first embodiment, the configuration of the semiconductor device is described with reference to the cross-sectional view in FIG. 10, but in the fifth embodiment, the configuration of the semiconductor device will be described also with reference to FIGS. 14 to 16 being plan views. Three patterns shown in FIGS. 14 to 16 are considered as arrangement patterns in plan views for achieving a unit cell structure like the unit cell structure of the IGBT in FIG. 10.

<Pattern in Which Cells are Arranged in a Lattice Shape (FIG. 14)>

Figure 14:
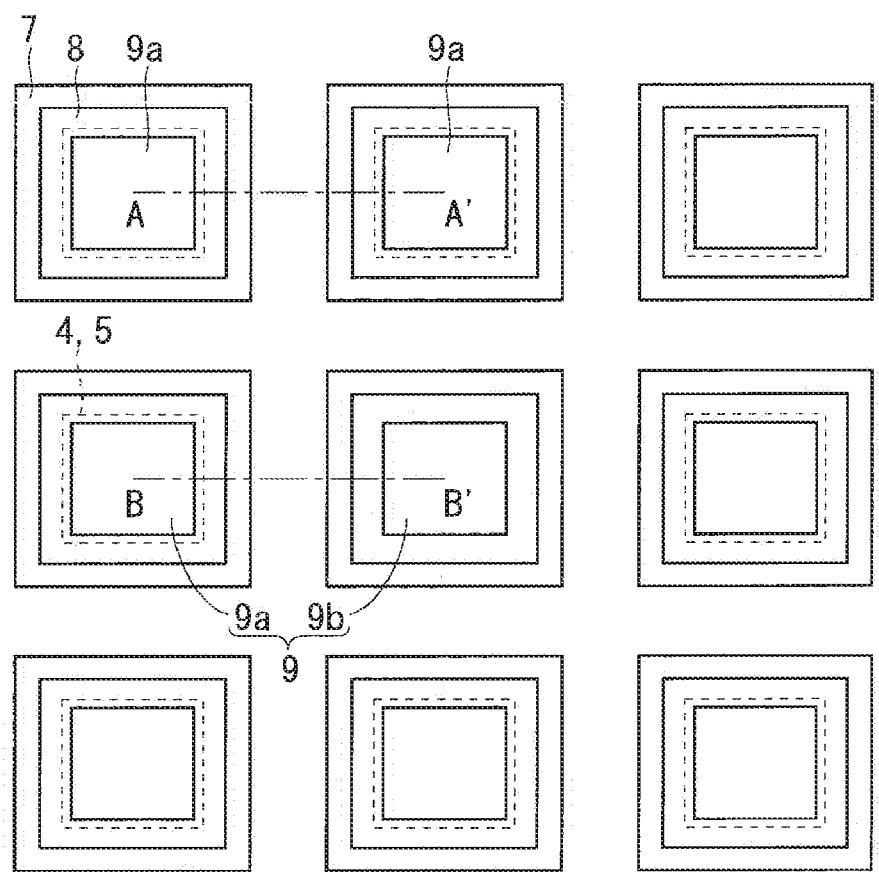
FIG. 14 is a plan view showing a configuration of a semiconductor device according to a fifth embodiment.
Figure 17:
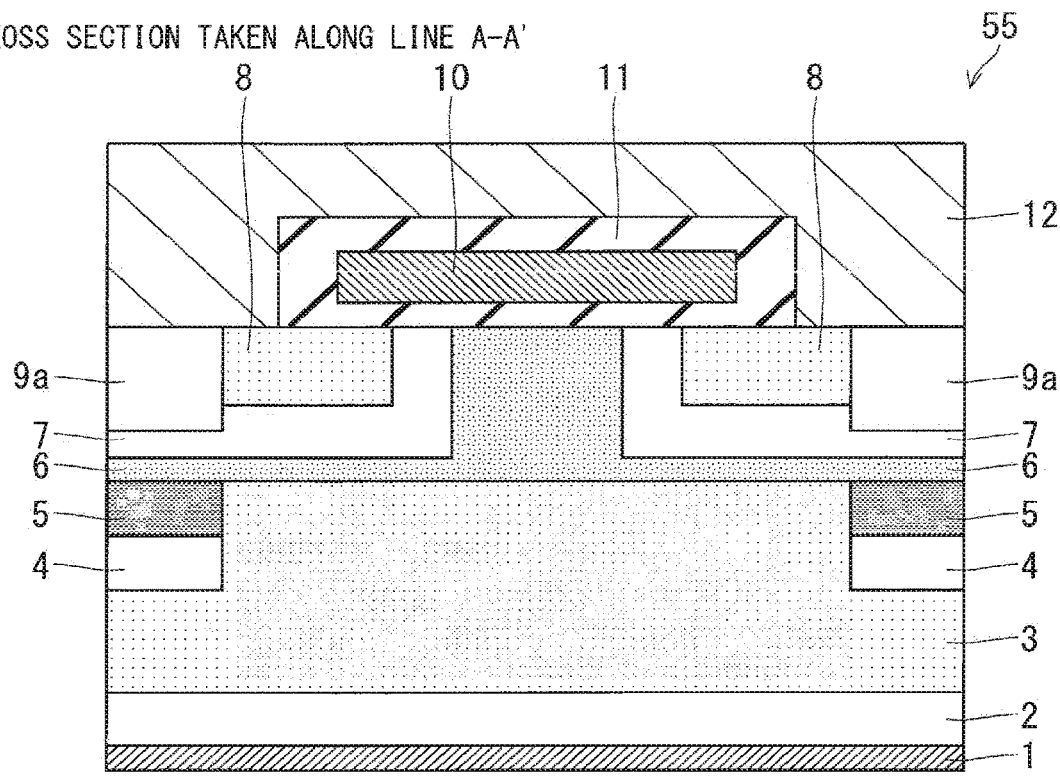
FIG. 17 is a cross-sectional view showing a configuration of the semiconductor device according to the fifth embodiment.
Figure 18:
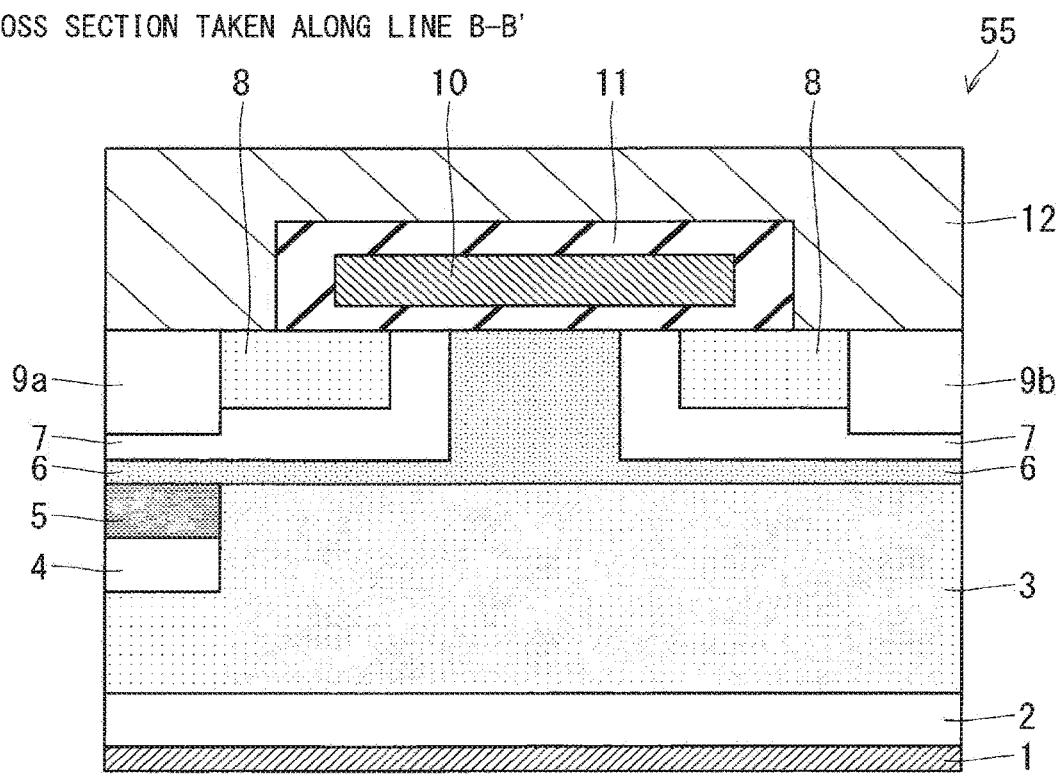
FIG. 18 is a cross-sectional view showing a configuration of the semiconductor device according to the fifth embodiment.

FIGS. 17 and 18 are cross-sectional views showing the configuration of the semiconductor device 55 according to the fifth embodiment, and respectively show the cross section taken along line A-A' in FIG. 14 and the cross section taken along line B-B' in FIG. 14. The base contact region 9 according to the fifth embodiment includes a first base contact region 9a below which the buried region 4 and the carrier trap region 5 are disposed, and a second base contact region 9b below which any of the buried region 4 and the carrier trap region 5 are not disposed. That is, the buried region 4 and the carrier trap region 5 are not disposed below all the base contact regions 9, and are appropriately thinned out.

In FIG. 14, only the base contact region 9 of one of the nine unit cells (the unit cell in the middle of FIG. 14) is the second base contact region 9b below which the buried region 4 and the carrier trap region 5 are not disposed. This allows reduction in on-resistance to be expected while minimizing the decrease in latch-up breakdown tolerance. The rate of thinning out the buried region 4 and the carrier trap region 5 can be appropriately adjusted based on the on-resistance and the latch-up breakdown tolerance which are required for the IGBT. For example, the adjustment is performed in consideration of the fact that as the thinning rate increases, the latch-up breakdown tolerance decreases and the on-resistance decreases.

<Pattern in Which Cells are Arranged in a Comb Shape (FIG. 15)>

FIGS. 17 and 18 are cross-sectional views showing the configuration of the semiconductor device 55 according to the fifth embodiment, and respectively show the cross section taken along line A-A' in FIG. 15 and the cross section taken along line B-B' in FIG. 15. As in the configuration in FIG. 14, also in the configuration in FIG. 15, the base contact region 9 includes the above-described first base contact region 9a and the above-described second base contact region 9b. Here, the second base contact region 9b is disposed between a plurality of the first base contact regions 9a extending and arranged in the vertical direction on the paper surface. In other words, the buried region 4 and the carrier trap region 5 are not disposed below all the base contact regions 9, and a plurality of the buried regions 4 and the carrier trap regions 5 are arranged spaced apart from each other in the vertical direction on the paper surface. This allows reduction in on-resistance to be expected while minimizing the decrease in latch-up breakdown tolerance. The clearance and the extending distance of the buried region 4 and the carrier trap region 5 can be appropriately adjusted based on the on-resistance and the latch-up breakdown tolerance which are required for the IGBT. For example, the adjustment is performed in consideration of the fact that as the clearance increases or the extending distance decreases, the latch-up breakdown tolerance decreases and the on-resistance decreases.

<Pattern in Which Cells are Arranged in a Stripe (FIG. 16)>

Figure 19:
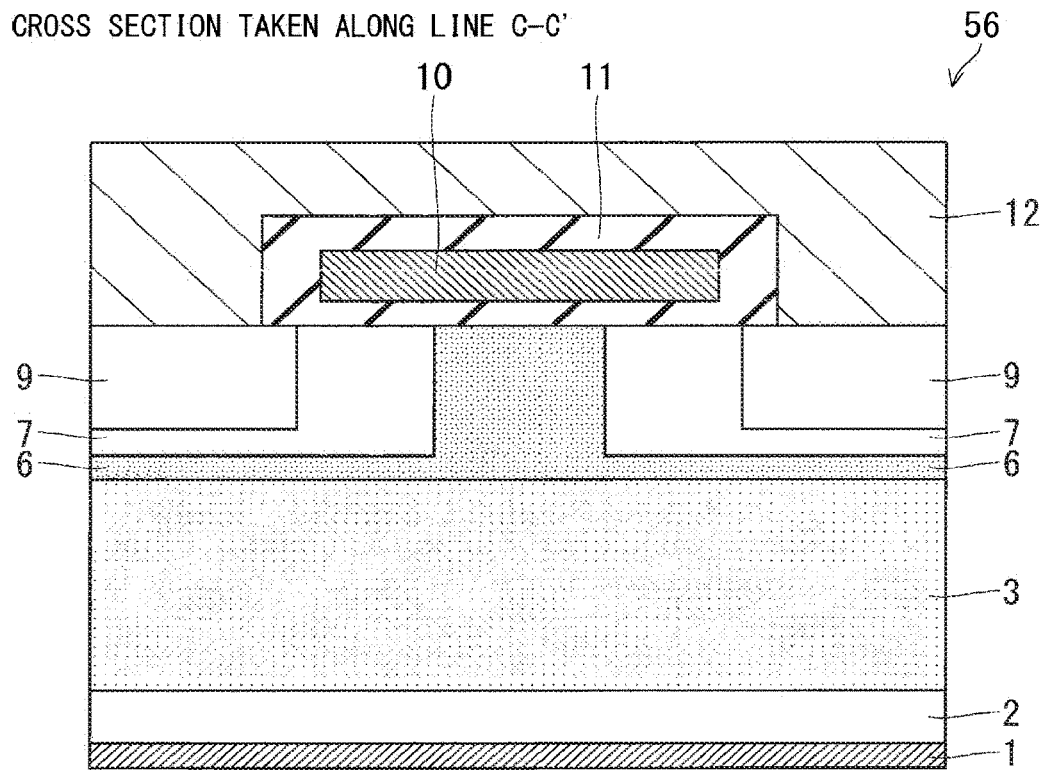
FIG. 19 is a cross-sectional view showing a configuration of the semiconductor device according to the fifth embodiment.
Figure 20:
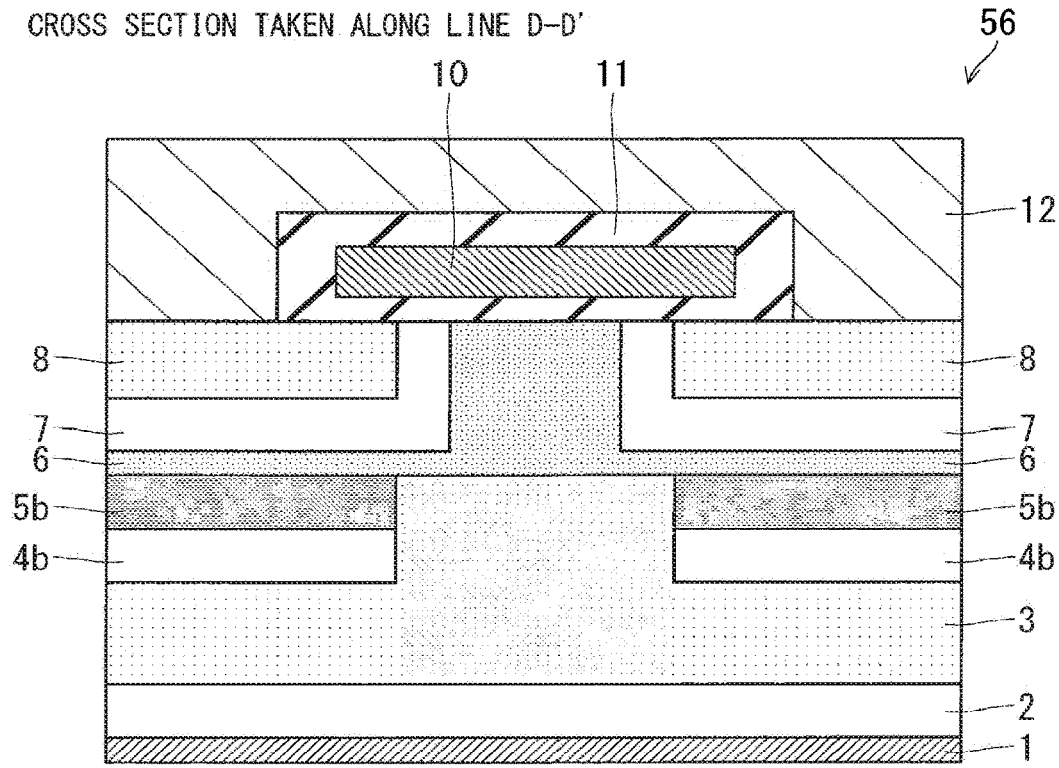
FIG. 20 is a cross-sectional view showing a configuration of the semiconductor device according to the fifth embodiment.

FIGS. 19 and 20 are cross-sectional views showing the configuration of the semiconductor device 56 according to the fifth embodiment, and respectively show the cross section taken along line C-C' in FIG. 16 and the cross section taken along line D-D' in FIG. 16. The buried region 4 and the carrier trap region 5 described thus far are disposed below the base contact region 9. On the other hand, in the configurations of FIGS. 16, 19 and 20, the buried region 4b and the carrier trap region 5b are not disposed below the base contact region 9, but are disposed below the emitter region 8. That is, since there is no concern about latch-up in a portion where a parasitic thyristor (pnpn structure) does not exist as shown in the cross section C-C' in FIG. 19, the buried region 4b and the carrier trap region 5b are disposed only in a portion where a parasitic thyristor (pnpn structure) exists as shown in the cross section D-D' in FIG. 20. This allows reduction in on-resistance to be expected while minimizing the decrease in latch-up breakdown tolerance.

It should be noted that in FIG. 16, an example in which the buried region 4b and the carrier trap region 5b are disposed below all the emitter regions 8 is shown, but these may be appropriately thinned out. For example, the buried region 4b and the carrier trap region 5b do not need to be disposed below one of the nine emitter regions 8. The rate of thinning out the buried region 4b and the carrier trap region 5b can be appropriately adjusted based on the on-resistance and the latch-up breakdown tolerance which are required for the IGBT. For example, the adjustment is performed in consideration of the fact that as the thinning rate increases, the latch-up breakdown tolerance decreases and the on-resistance decreases.

As described with the three patterns above, partially forming the buried region and the carrier trap region in a plan view allows the latch-up breakdown tolerance and the on-resistance to be appropriately adjusted.

Modifications of First to Fifth Embodiments

Figure 21:
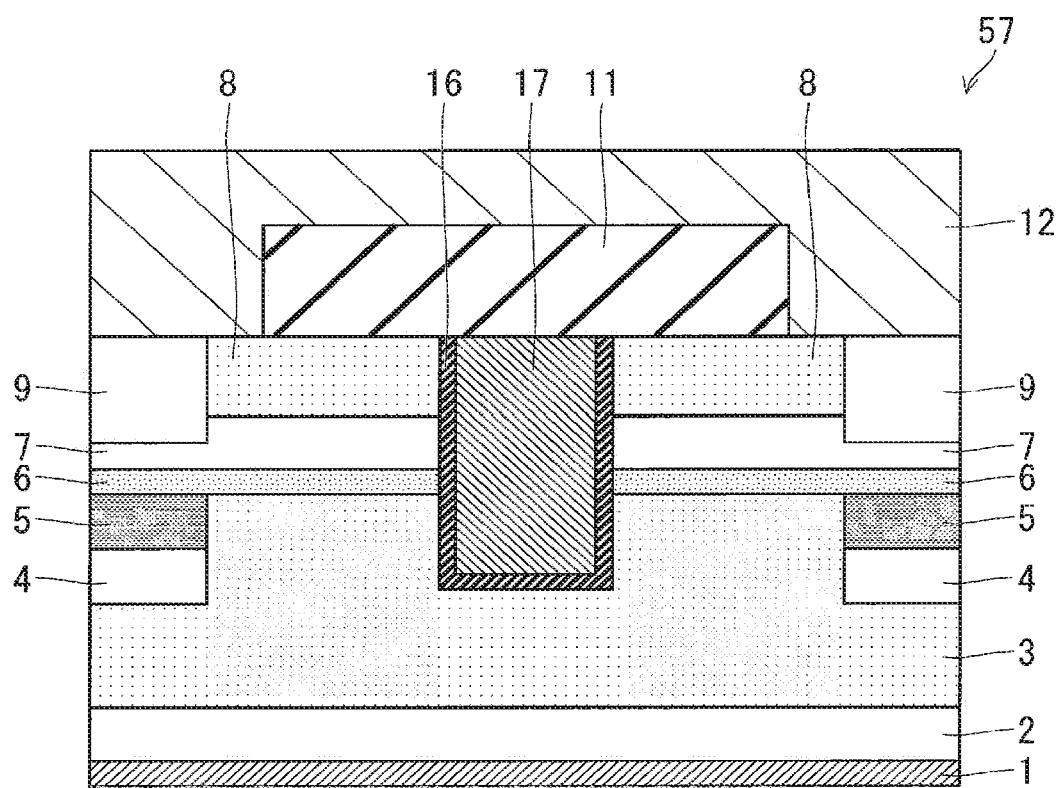
FIG. 21 is a cross-sectional view showing a configuration of a semiconductor device according to a modification.

The semiconductor devices 51 to 56 according to the first to fifth embodiments are described as being planar gate type SiC-IGBTs. However, the semiconductor device according to the present invention is not limited to this, and may be, for example, a trench gate type SiC-IGBT. That is, a semiconductor device 57 including a gate oxide film 16 and a gate electrode 17 disposed in a trench as shown in FIG. 21, instead of the gate electrode 10 in FIG. 3, may be used. Even in this semiconductor device 57, it is possible to improve the latch-up breakdown tolerance while reducing the on-resistance. The crystal type and conductivity type of SiC and preferable numerical ranges of concrete thickness and impurity concentration of each layer are well known to those skilled in the art, and these numerical values described in the embodiments can be appropriately changed.

The semiconductor devices 51 to 57 described above use SiC as the semiconductor material. Since SiC has a wider band gap than Si, in the same withstand voltage design, the impurity concentration of the drift region of the SiC-IGBT can be made one or more digits higher than the impurity concentration of the drift region of the Si-IGBT. However, on the other hand, the latch-up breakdown is likely to occur due to the high impurity concentration of the drift region. Therefore, in order to reduce the operation of the parasitic thyristor of the pnpn structure and reliably prevent the latch-up during the off operation of the IGBT, as in the semiconductor devices 51 to 57 described above, providing the buried region and the carrier trap region should reduce holes reaching the emitter region.

In addition, in the present invention, each embodiment can be freely combined, and each embodiment can be appropriately modified, or omitted within the scope of the present invention.

Although the present invention is described in detail, the above description is, in all embodiments, illustrative, and the present invention is not limited to the above description. It is understood that innumerable modifications not illustrated can be envisaged without departing from the scope of the present invention.

EXPLANATION OF REFERENCE SIGNS

1: collector electrode
2: collector region
3: drift region
4, 4b: buried region
5, 5a, 5b: carrier trap region
6: carrier accumulation region
7: base region
8: emitter region
9: base contact region
9a: first base contact region
9b: second base contact region
10: gate electrode
12: emitter electrode
13: carrier trap reduction region
51, 52, 53, 54, 55, 56, 57: semiconductor device
80: SiC substrate

The invention claimed is:
1. A semiconductor device comprising:
a collector electrode;
a collector region of a first conductivity type disposed on the collector electrode;
a drift region of a second conductivity type disposed on the collector region;
a carrier accumulation region of the second conductivity type disposed on the drift region, the carrier accumulation region having an impurity concentration higher than an impurity concentration of the drift region;
a base region of the first conductivity type selectively disposed in an upper surface of the carrier accumulation region;
an emitter region of the second conductivity type and a base contact region of the first conductivity type adjacent to each other, selectively disposed in an upper surface of the base region;
a gate electrode capable of forming a channel in the base region;
an emitter electrode connected to the emitter region and the base contact region;
a buried region of the first conductivity type disposed in the drift region below the base contact region or the emitter region; and
a carrier trap region disposed between the buried region and the base region, the carrier trap region having a carrier lifetime shorter than a carrier lifetime of the drift region.

2. The semiconductor device according to claim 1, wherein the carrier trap region is directly connected to the base region.

3. The semiconductor device according to claim 1, wherein the carrier trap region has the second conductivity type and an impurity concentration higher than an impurity concentration of the drift region.

4. The semiconductor device according to claim 1, wherein the carrier trap region has the first conductivity type.

5. The semiconductor device according to claim 1, further comprising a carrier trap reduction region of the second conductivity type disposed between the buried region and the collector region, the carrier trap reduction region having a carrier lifetime longer than a carrier lifetime of the drift region.

6. The semiconductor device according to claim 1, wherein
the base contact region includes
a first base contact region below which the buried region and the carrier trap region are disposed, and a second base contact region below which any of the buried region and the carrier trap region is not disposed.

7. The semiconductor device according to claim 1, wherein a semiconductor material of the semiconductor device includes SiC.

8. The semiconductor device according to claim 1, wherein an impurity concentration of the drift region is not less than $1\times10^{12}$ cm$^{-3}$ and not more than $1\times10^{15}$ cm$^{-3}$.

9. A method for manufacturing a semiconductor device, the method comprising the steps of:
forming a collector region of a first conductivity type on a SiC substrate of a second conductivity type;
forming a drift region of the second conductivity type on the collector region, a carrier accumulation region of the second conductivity type having a higher impurity concentration than the drift region on the drift region, a base region of the first conductivity type in an upper surface of the carrier accumulation region, an emitter region of the second conductivity type and a base contact region of the first conductivity type adjacent to each other in an upper surface of the base region, a buried region of the first conductivity type in the drift region below the base contact region or the emitter region, and a carrier trap region between the buried region and the base region, the carrier trap region having a carrier lifetime shorter than a carrier lifetime of the drift region;
forming a gate electrode capable of forming a channel in the base region;
forming an emitter electrode connected to the emitter region and the base contact region; and
forming a collector electrode connected to the collector region,
wherein after forming a structure from the collector region to the emitter electrode on the SiC substrate, the SiC substrate is removed, and the collector electrode is formed under the collector region exposed by the removal.

10. A method for manufacturing a semiconductor device, the method comprising the steps of:

forming a collector region of a first conductivity type on a SiC substrate of a second conductivity type;

forming a drift region of the second conductivity type on the collector region, a carrier accumulation region of the second conductivity type having a higher impurity concentration than the drift region on the drift region, a base region of the first conductivity type in an upper surface of the carrier accumulation region, an emitter region of the second conductivity type and a base contact region of the first conductivity type adjacent to each other in an upper surface of the base region, a buried region of the first conductivity type in the drift region below the base contact region or the emitter region, and a carrier trap region between the buried region and the base region, the carrier trap region having a carrier lifetime shorter than a carrier lifetime of the drift region;

forming a gate electrode capable of forming a channel in the base region;

forming an emitter electrode connected to the emitter region and the base contact region; and forming a collector electrode connected to the collector region, wherein after forming the drift region on the SiC substrate by epitaxial growth, the SiC substrate is removed, the collector region is formed by ion implantation into the drift region exposed by the removal, and the collector electrode is formed under the collector region.

* * * * *